United States Patent
Diao et al.

(10) Patent No.: US 10,350,728 B2
(45) Date of Patent: Jul. 16, 2019

(54) SYSTEM AND PROCESS FOR IN SITU BYPRODUCT REMOVAL AND PLATEN COOLING DURING CMP

(71) Applicant: Applied Materials, Inc., Santa Clara, CA (US)

(72) Inventors: Jie Diao, Fremont, CA (US); Erik S. Rondum, San Ramon, CA (US); Thomas Ho Fai Li, San Jose, CA (US); Bum Jick Kim, Irvine, CA (US); Christopher Heung-Gyun Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/919,406

(22) Filed: Oct. 21, 2015

(65) Prior Publication Data
US 2016/0167195 A1    Jun. 16, 2016

Related U.S. Application Data

(60) Provisional application No. 62/091,284, filed on Dec. 12, 2014.

(51) Int. Cl.
*B24B 37/04*     (2012.01)
*B24B 53/017*    (2012.01)
(Continued)

(52) U.S. Cl.
CPC .......... *B24B 53/017* (2013.01); *B24B 37/04* (2013.01); *B24B 57/02* (2013.01);
(Continued)

(58) Field of Classification Search
CPC .......... H01L 21/30625; H01L 21/3212; H01L 21/7684; H01L 21/67051; H01L 21/31051;
(Continued)

(56) References Cited

U.S. PATENT DOCUMENTS 5,645,682 A * 7/1997 Skrovan ............... B24B 53/017
                                                    438/692
5,705,435 A    1/1998 Chen
(Continued)

FOREIGN PATENT DOCUMENTS

CN    101291777 A    10/2008
CN    103878688 A    6/2014
(Continued)

*Primary Examiner* — Jeffrie R Lund
*Assistant Examiner* — Mirza Israr Javed
(74) *Attorney, Agent, or Firm* — Patterson & Sheridan, LLP (57) ABSTRACT

Polishing pad cleaning systems and related methods are disclosed. A rotatable platen comprising a polishing pad in combination with a fluid, such as a polishing fluid, contacts a substrate to planarize material at the surface thereof and resultantly creates debris. A cleaning system introduces a spray system to remove debris from the polishing pad to prevent substrate damage and improve efficiency, a waste removal system for removing used spray, used polishing fluid, and debris from the polishing pad, and a polishing fluid delivery system for providing fresh polishing fluid to the polishing pad, such that the substrate only receives fresh polishing fluid upon each complete rotation of the platen. In this manner, within die performance is enhanced, the range of certain CMP processes is improved, scratches and contamination are avoided for each polished substrate and for later-polished substrates, and platen temperatures are reduced.

19 Claims, 5 Drawing Sheets

(51) Int. Cl.
 *H01L 21/306* (2006.01)
 *H01L 21/3105* (2006.01)
 *B24B 57/02* (2006.01)

(52) U.S. Cl.
 CPC .. *H01L 21/30625* (2013.01); *H01L 21/31051* (2013.01); *H01L 2224/118* (2013.01); *H01L 2224/27616* (2013.01); *H01L 2224/27845* (2013.01)

(58) Field of Classification Search
 CPC ..... H01L 21/32115; H01L 2224/27845; H01L 2224/27616; H01L 2224/118; B24B 37/11; B24B 53/017; B24B 37/04; B24B 37/30; B81C 2201/0104; C09G 1/04; G05B 2219/45232
 USPC .......................... 156/345.12, 345.18, 345.21
 See application file for complete search history.

(56) References Cited

U.S. PATENT DOCUMENTS

| | | | | |
|---|---|---|---|---|
| 5,709,593 A | * | 1/1998 | Guthrie | B24B 57/02 451/285 |
| 5,728,224 A | * | 3/1998 | Laurent | C23C 16/401 118/50.1 |
| 5,779,522 A | | 7/1998 | Walker et al. | |
| 5,916,010 A | | 6/1999 | Varian et al. | |
| 5,997,392 A | * | 12/1999 | Chamberlin | B24B 57/02 451/287 |
| 6,022,414 A | * | 2/2000 | Miller | C03C 17/002 118/715 |
| 6,139,404 A | * | 10/2000 | Yau | B24B 37/04 451/443 |
| 6,227,947 B1 | | 5/2001 | Hu et al. | |
| 6,284,092 B1 | * | 9/2001 | Manfredi | B24B 57/02 156/345.12 |
| 6,383,332 B1 | * | 5/2002 | Shelton | B05B 15/10 118/302 |
| 6,386,963 B1 | | 5/2002 | Kenji et al. | |
| 6,572,446 B1 | | 6/2003 | Osterheld et al. | |
| 6,609,957 B2 | * | 8/2003 | Chopra | B24B 37/04 257/E21.304 |
| 6,609,962 B1 | * | 8/2003 | Wakabayashi | B24B 1/04 451/443 |
| 6,899,592 B1 | * | 5/2005 | Kojima | B24B 37/245 451/286 |
| 7,004,820 B1 | | 2/2006 | Teng et al. | |
| 7,021,999 B2 | * | 4/2006 | Jiang | B24B 53/017 451/444 |
| 7,182,680 B2 | | 2/2007 | Butterfield et al. | |
| 7,210,988 B2 | * | 5/2007 | Wang | B24B 53/017 451/443 |
| 7,455,575 B2 | * | 11/2008 | Kim | B24B 53/017 451/41 |
| 7,666,061 B2 | | 2/2010 | Butterfield et al. | |
| 7,753,761 B2 | * | 7/2010 | Fujita | B24B 37/04 451/443 |
| 2002/0016136 A1 | | 2/2002 | Birang et al. | |
| 2004/0087257 A1 | | 5/2004 | Hong | |
| 2007/0207707 A1 | | 9/2007 | Montierth et al. | |
| 2009/0194509 A1 | * | 8/2009 | Nada | B05C 5/0254 216/83 |
| 2014/0273763 A1 | | 9/2014 | Lee et al. | |
| 2016/0114459 A1 | * | 4/2016 | Butterfield | B24B 53/017 216/53 |

FOREIGN PATENT DOCUMENTS

| | | |
|---|---|---|
| JP | 2008270360 A | 11/2008 |
| KR | 1020100034618 A | 4/2010 |

* cited by examiner

SYSTEM AND PROCESS FOR IN SITU BYPRODUCT REMOVAL AND PLATEN COOLING DURING CMP

CROSS-REFERENCE TO RELATED APPLICATIONS

This application claims benefit of U.S. Provisional Patent Application No. 62/091,284, filed Dec. 12, 2014, the entirety of which is herein incorporated by reference.

BACKGROUND

Field

Embodiments of the present disclosure generally relate to creating planar surfaces on substrates and on layers formed on substrates, including an apparatus for cleaning a polishing pad, and methods of using the same. More specifically, the present disclosure relates to chemical-mechanical polishing (CMP).

Description of the Related Art

In the fabrication of integrated circuits and other electronic devices, multiple layers of conducting, semiconducting, and dielectric materials are deposited on or removed from a surface of a substrate, such as a semiconductor substrate or a glass substrate. As layers of material are sequentially deposited on and removed from the substrate, the uppermost surface of the substrate may become non-planar and call for planarization and/or polishing before further lithographic patterning can be patterned thereon. Planarization and polishing are procedures where previously deposited material is removed from the feature side of a substrate to form a generally even, planar, or level surface. Planarization and polishing are useful in removing undesired surface topography and surface defects, such as rough surfaces, agglomerated materials, crystal lattice damage, scratches, and contaminated layers or materials. Planarization is also useful in forming features on a substrate by removing excess material which has been deposited to fill the features, and to provide an even surface for subsequent lithography-based patterning steps.

Chemical mechanical planarization, or chemical mechanical polishing (CMP), is a common technique which is useful in removing undesired surface topography, or in forming features on a substrate by removing excess deposited material used to fill the features and to provide an even or level surface for subsequent deposition and processing. In conventional CMP techniques, a substrate carrier or polishing head is mounted on a carrier assembly to position a substrate secured therein in contact with a polishing pad in a CMP apparatus. The carrier assembly provides a controllable pressure to the substrate against the polishing pad. The polishing pad is moved relative to the substrate by an external driving force. Thus, the CMP apparatus creates polishing or rubbing movement between the surface of the substrate and the polishing pad while dispersing a polishing composition, or slurry, to affect both chemical activity and mechanical activity. Relative motion is provided between the substrate and polishing surface to planarize the surface of the substrate in contact with the pad through one or a combination of a chemical, mechanical, or electrochemical process. The polishing pad has a precise shape to distribute the polishing fluid and contact the substrate. The polishing pad may be cleaned to remove debris which would otherwise collect upon the polishing pad and cause damage to substrates processed therewith and reduce the polishing pad life.

Conventional methods of cleaning may involve directing de-ionized water (DIW) spray against the polishing pad. The spray often causes slurry and debris to become deposited on the pad and thereby collect in undesirable locations resulting in substrate contamination or scratching of later-polished substrates. The spray may also create a mist or include the debris, which can accumulate in a manufacturing facility to reduce the overall cleanliness of the facility and scratch later-polished substrates. Reducing the velocity of the spray to better control the debris has the effect of reducing the effectiveness of the debris removal from the polishing pad.

What is needed in the art is a method and apparatus for improving the range of certain CMP processes. Specifically, what is needed is an improved method and apparatus for cleaning of the polishing pad by effectively removing debris which may minimize the potential to contaminate or scratch later-polished substrates.

SUMMARY

Embodiments disclosed herein include polishing pad cleaning systems and related methods. A rotatable platen comprising a polishing pad in combination with a fluid, such as a polishing fluid, contacts a substrate to planarize material at the surface thereof and resultantly creates debris. A spray system introduces a spray nozzle system to remove the debris from the polishing pad to prevent substrate damage and improve efficiency. A waste removal system removes used spray, used polishing fluid, and debris from the polishing pad, and a polishing fluid delivery system provides fresh polishing fluid to the polishing pad. The spray system, the waste removal system, and the polishing fluid delivery arm system are continuously active through each full rotation of the platen during processing such that the substrate only receives fresh polishing fluid upon each complete rotation of the platen. In this manner, within die performance is enhanced, scratches and contamination are avoided for each polished substrate and for later-polished substrates, and platen temperatures are reduced.

In one embodiment, a method for cleaning the surface of a polishing pad is disclosed. The method includes providing new polishing fluid to the polishing surface of the polishing pad and polishing a substrate on the polishing surface of the polishing pad. The method also includes spraying the surface of the polishing pad to lift debris and used polishing fluid from the polishing surface of the polishing pad and remove used polishing fluid, used spray, and debris from the polishing surface of the polishing pad. The method further includes repeating the above method.

In another embodiment, a method for cleaning a surface of a polishing pad is disclosed. The method includes spraying the surface of the polishing pad to lift debris and used polishing fluid from the surface of the polishing pad during each full revolution of the polishing pad and applying a waste removal system to the polishing pad to remove debris and used polishing fluid from the surface of the polishing pad during each full revolution of the polishing pad. The method also includes providing new polishing fluid to the surface of the polishing pad during each full revolution of the polishing pad. The method further includes polishing a substrate on the surface of the polishing pad during each full revolution of the polishing pad, wherein the substrate is only polished with new, fresh polishing fluid.

In another embodiment, a cleaning system for a polishing pad is disclosed. The cleaning system includes a processing system including a chamber body, a rotatable platen comprising a polishing pad disposed thereon, and a substrate carrier head configured to retain a substrate against a surface of the polishing pad. The substrate carrier head is coupled to the chamber body at a first location. The processing system also includes a spray system coupled to the chamber body at a second location, the second location disposed radially about a central axis of the platen and located between the first location and a third location, wherein the spray system is configured to provide a de-ionized water spray to the polishing pad surface. The water spray removes used polishing fluid and debris. The processing system further includes a waste removal system coupled to the chamber body at the third location which is disposed radially about the central axis of the platen and is between the second location and a fourth location. The waste removal system is configured to remove a mixture of used spray and used polishing fluid from the polishing pad, and a polishing fluid delivery system is coupled to the chamber body at the fourth location which is disposed radially about the central axis of the platen and located between the third location and the first location. The polishing fluid delivery system is configured to provide new polishing fluid to the polishing pad surface. The spray system, the waste removal system, and the polishing fluid delivery arm system are continuously utilized in real time during operation of the polishing system.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

BRIEF DESCRIPTION OF THE DRAWINGS

So that the manner in which the above-recited features of the present disclosure can be understood in detail, a more particularized description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Whenever possible, like reference numerals will be used to refer to like components or parts.

Embodiments disclosed herein include polishing pad cleaning systems and related methods. A rotatable platen comprising a polishing pad in combination with a fluid, such as a polishing fluid, contacts a substrate to planarize material at the surface thereof and resultantly creates debris. A cleaning system introduces a spray system to remove debris from the polishing pad to prevent substrate damage and improve efficiency, a waste removal system for removing used spray, used polishing fluid, and debris from the polishing pad, and a polishing fluid delivery system for providing fresh polishing fluid to the polishing pad, such that the substrate only receives new, fresh polishing fluid upon each complete rotation of the platen. In this manner, within die performance is enhanced, scratches and contamination are avoided for each polished substrate and for later-polished substrates, and platen temperatures are reduced and stabilized.

The term "substantially free" as used herein is defined as greater than about 90% free of polishing fluid, debris, and other substances.

Figure 1:
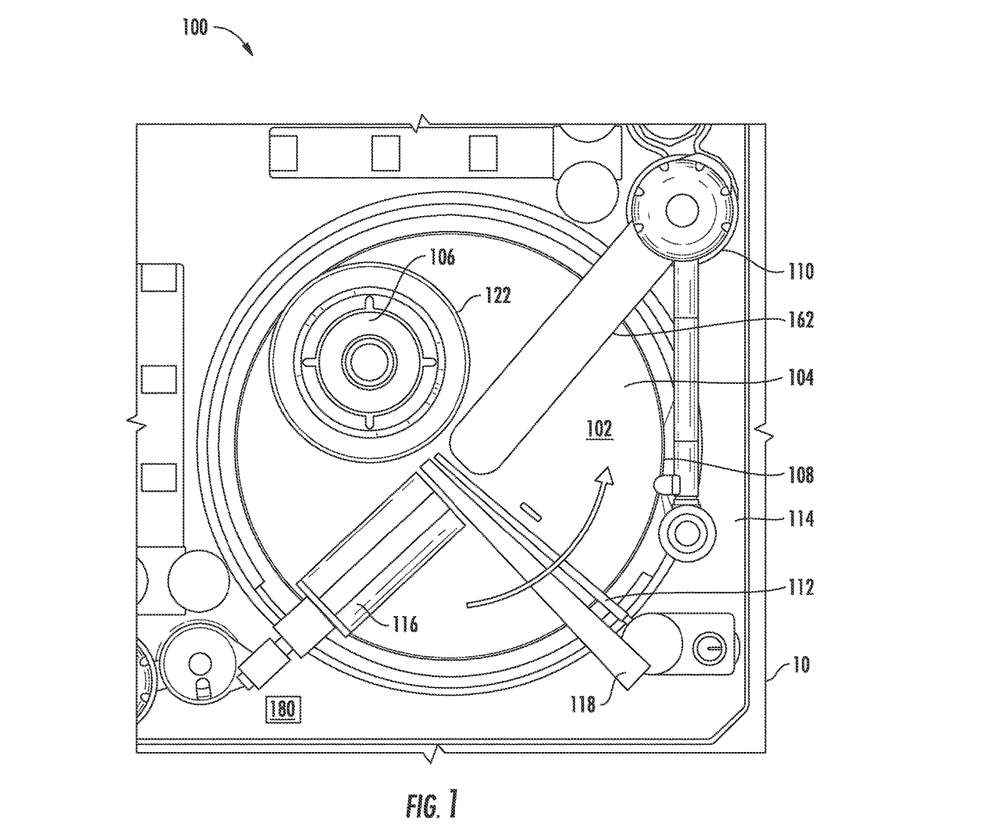
FIG. 1 is a top plan view of one embodiment of a processing station.

FIG. 1 is a top plan view of an exemplary processing station 100, located within a process chamber body 10, and configured to perform a polishing process, such as a CMP or electrochemical mechanical planarization (ECMP) process, while also being configured to clean a polishing surface 102 of a polishing pad 104. The processing station 100 may be a stand-alone unit or part of a larger processing system. Examples of a larger processing system that the processing station 100 may be utilized with include REFLEXION®, REFLEXION LK™, and MIRRA MESA® polishing systems, all available from Applied Materials, Inc. located in Santa Clara, Calif. It is contemplated that other processing stations may be adapted to benefit from the disclosure, including those from other equipment manufactures.

The processing station 100 includes a substrate carrier head 106, a platen 108, an optional conditioning module 110, and a polishing fluid delivery assembly 112 (such as a slurry delivery assembly). The platen 108, an optional conditioning module 110, and the polishing fluid delivery assembly 112 may be mounted to a base 114 of the processing station 100.

The platen 108 supports the polishing pad 104. The platen 108 is rotated by a motor (not shown) so that the polishing pad 104 is rotated relative to a substrate 122 retained in the substrate carrier head 106 during processing. As such, terms such as upstream, downstream, in front, behind, before, and after are generally to be interpreted relative to the motion or direction of the platen 108 and the polishing pad 104 supported thereon, as appropriate.

The processing station 100 also includes a spray system 116 and a cleaning system 118. The platen 108, the conditioning module 110, and the polishing fluid delivery assembly 112 may be mounted to the base 114 of the processing station 100, and located inside the chamber body 10. The polishing fluid delivery assembly may be located behind the substrate carrier head 106. The polishing fluid delivery assembly 112 includes one or more nozzles (not shown) coupled to a polishing fluid source (not shown) by a delivery line 170 and configured to deliver polishing fluid 124, such as slurry, to the polishing surface 102.

The processing station 100 is used to planarize a process surface 120 of a substrate 122 in the presence of a polishing fluid 124, so that undesirable topography and surface defects are removed therefrom. As part of this process, debris 126 is generated and collected on the polishing pad 104. As discussed infra, in relation to FIGS. 1, 2, and 3, the spray system 116 employs a spray body 130 and a group of fluid outlets 132 to direct fluid under the spray body 130 to the polishing pad 104. In some embodiments the fluid may be directed under the spray body 130 and towards an inlet port of the spray body 130. In some embodiments, a second group of fluid outlets may also be used. Furthermore, as discussed infra, in relation to FIGS. 1 and 2, the cleaning system 118 may employ an enclosure body 140 having an inlet opening 142 and an exit opening 144. The exit opening 144 is in communication with a vacuum source 146 to create airflow from the inlet opening 142 to the exit opening 144. The airflow may dislodge debris 126 and the fluid 124 from the polishing pad 104 and this airflow carries the dislodged items through the enclosure body 140. The cleaning system 118 includes a containment wall 148 extending from the inlet opening to a lip 150 disposed within the enclosure body 140. In this manner, the debris 126 and the fluid 124 within the enclosure body 140 may be prevented by the containment wall 148 from returning to the polishing pad 104. Before discussing details of the spray system 116 or the cleaning system 118, the operation and other components of the CMP processing station 100 are now introduced to provide context as the polishing pad 104, the optional conditioning module 110, and the polishing fluid delivery assembly 112, are now discussed in terms of their operation as part of the CMP processing station 100.

In this regard, the polishing pad 104 and a substrate carrier head 106 of the CMP processing station 100 may be used to planarize the process surface 120 of the substrate 122 against the polishing pad 104 by use of physical contact of the process surface 120 of the substrate 122 against the polishing pad 104 and by use of relative motion. The planarization removes undesired surface topography and surface defects in preparation for subsequent processes where layers of materials are sequentially deposited on and removed from the process surface 120 of the substrate 122. The substrate 122 may be, for example, a semiconductor wafer. During planarization, the substrate 122 may be mounted in the substrate carrier head 106 and the process surface 120 of the substrate 122 is positioned by a carrier assembly 128 of the CMP processing station 100 to contact the polishing pad 104 of the processing station 100. The carrier assembly 128 provides a controlled force F to the substrate 122 mounted in the substrate carrier head 106 to urge the process surface 120 of the substrate 122 against a working polishing surface 102 of the polishing pad 104. In this manner, contact is created between the substrate 122 and the polishing pad 104.

Removal of the undesirable topography and surface defects is also accomplished by relative rotational movement between the polishing pad 104 and the substrate 122 in the presence of a fluid 124, such as a polishing fluid or slurry, therebetween. A platen 108 of the processing station 100 supports the polishing pad 104 and provides rotational movement R1 to the polishing pad 104 about an axis of rotation A1. The platen 108 may be rotated by a motor in a base (not shown) of the processing station 100. The carrier assembly 128 may also provide rotational movement R2 about an axis of rotation A2 to the substrate 122 mounted within the substrate carrier head 106. Within the environment of this relative motion is the fluid 124. The polishing surface 102 of the polishing pad 104 may be generally planar, but may also include grooves (not shown) which may improve the performance of the polishing pad 104 by distributing the fluid 124 which is applied to the polishing surface 102 by use of the polishing fluid delivery assembly 112. The fluid 124 may include a chemical composition, typically mixed with an abrasive, for selective removal of material from the process surface 120 of the substrate 122. The fluid delivery assembly 112 may dispose the fluid 124 at one or more radii of the polishing pad 104 before, during, or after relative motion. As one skilled in the art would understand, the polishing pad 104 may include features that would retain the polishing media, e.g. pores and/or polishing pad grooves found in the polishing pad 104. The fluid 124, characteristics of the polishing pad 104, the force F, and the rotational movements R1, R2 create frictional forces and abrasive forces at the process surface 120 of the substrate 122. These frictional forces and the abrasive forces generate debris 126 as the undesired surface topography and surface defects are removed from the process surface 120 of the substrate 122. In this manner, the debris 126 may collect on the polishing surface 102 of the polishing pad 104 and in the fluid 124, and if not removed, may contaminate or scratch later-polished substrates.

The CMP processing station 100 may include other components to enable consistent polishing. With continued reference to FIGS. 1 and 2, during planarization the frictional forces and abrasive forces may also cause wear to the polishing pad 104 which may necessitate periodic roughening (conditioning) to maintain the effectiveness of the polishing pad 104 and ensures consistent polishing rates. In this regard, the processing station 100 may optionally comprise a conditioning module 110 with the conditioning head 160 mounted to one end of the pivot arm 162, and a pad conditioner 164, such as a pad embedded with diamond crystals, mounted to the underside of the conditioning head 160. The pivot arm 162 may be operatively connected to the platen 108, and may maintain the pad conditioner 164 against the polishing pad 104 as the pivot arm 162 sweeps back and forth across the radius of the polishing pad 104 in an arcing motion to condition the polishing pad 104. In this manner, the polishing pad 104 may be optionally conditioned to provide consistent polishing rates.

In addition to optional conditioning, the polishing pad 104 may also be maintained within the processing station 100 by cleanings using the spray system 116. Frequent cleaning of the polishing pad 104 is performed with the spray system 116 to clean at least some of the debris 126 (polishing residue and compacted abrasives from the fluid) from the polishing pad 104. In one embodiment, this cleaning may comprise a real time cleaning which does not involve removing the substrate 122 mounted within the substrate carrier head 106 from contact with the polishing pad 104 or turning off the supply of fluid 124 from the polishing fluid delivery assembly 112. In other words, the spray system 116 may direct fluid, for example, de-ionized water at the working polishing surface 102 of the polishing pad 104 in real time and during the planarization of a substrate 122. The fluid may dislodge some of the debris 126 from the polishing pad 104 for later removal, for example, by the cleaning system 118 as discussed herein. In this manner, the spray system 116 may contribute to the cleanings of the polishing pad 104 such that the substrate 122 only receives new, fresh polishing fluid 124 with each rotation of the platen 108. Furthermore, the spray system 116 assists in stabilizing the temperature of the platen.

A controller 180 disposed in the chamber body 10 is programmed to remove polishing fluid and provide new polishing fluid between polishing cycles. In one embodiment, the controller 180 is programmed to provide new polishing fluid to the polishing surface of the polishing pad, polish a substrate on the polishing surface of the polishing pad, spray the surface of the polishing pad to lift debris and used polishing fluid from the polishing surface of the polishing pad, remove used polishing fluid, used spray, and debris from the polishing surface of the polishing pad, and repeat the above, as needed.

Now that the operation of the CMP processing station 100 has been introduced, the spray system 116 and the cleaning system 118 are discussed in detail.

Figure 2:
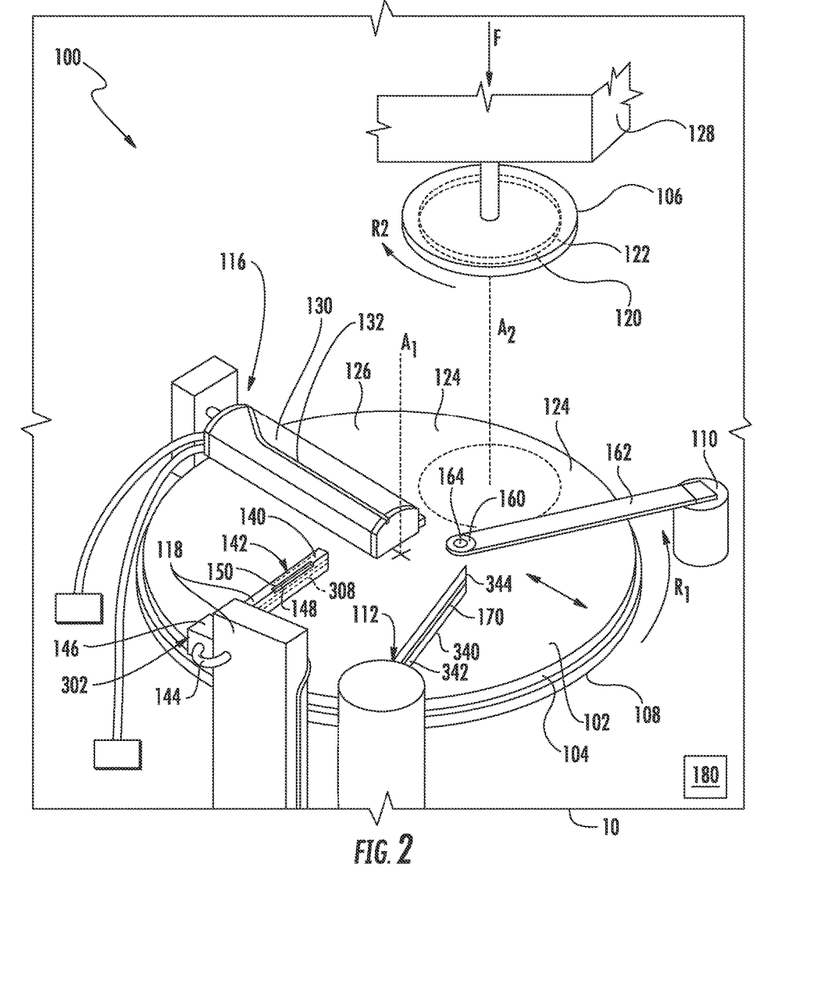
FIG. 2 is a top perspective view of an exemplary chemical-mechanical polishing (CMP) system employing a system to remove debris and fluid from a polishing pad of the CMP system.
Figure 3:
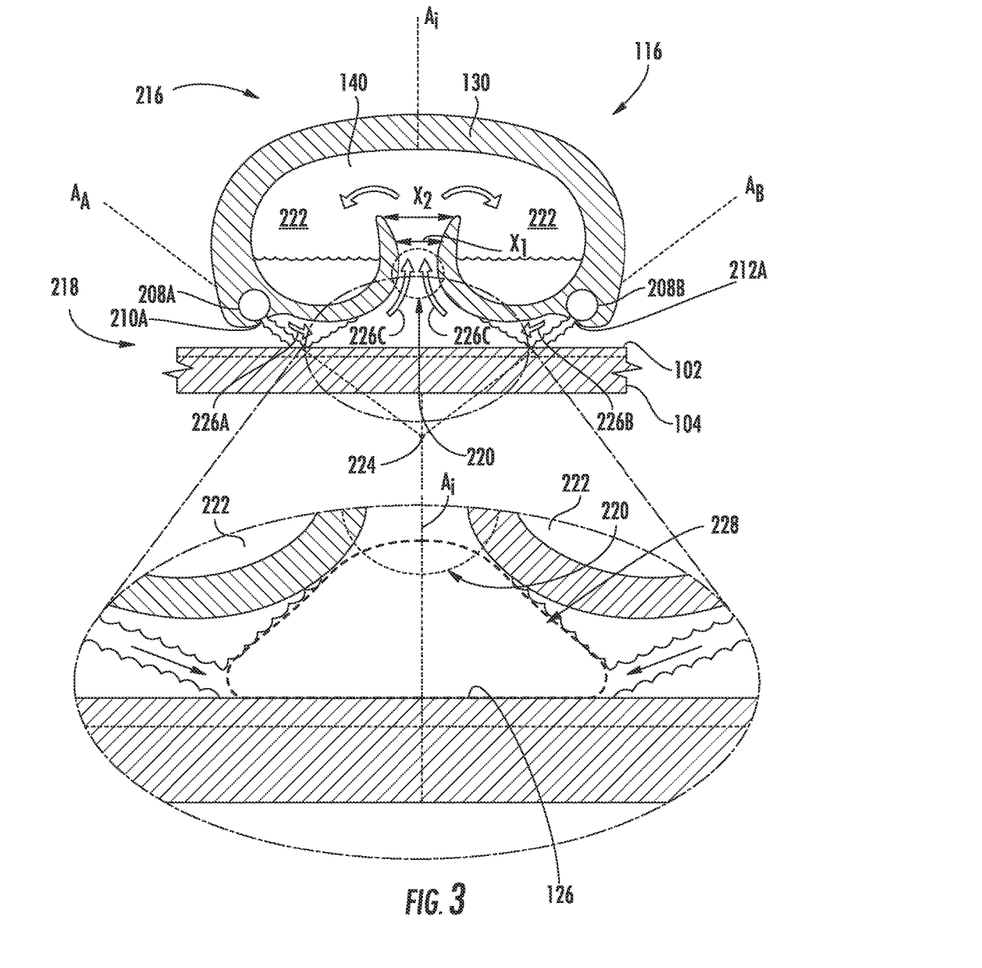
FIG. 3 is a front sectional view of the spray system of FIG. 1 proximate to the polishing pad to be cleaned of debris, the spray system is depicted to include the spray body and a group of fluid outlets supported by the spray body and arranged to direct fluid along respective fluid outlet center axes, wherein the fluid outlet center axes are angled relative to each other and directed to intersect at, or adjacent to, an inlet port center axis of an associated inlet port of the spray body.

Embodiments of the spray system 116 are now discussed in detail. In this regard, FIG. 2 is a top perspective view of the top down view of FIG. 1, and FIG. 3 is a front sectional view of the spray system 116 of FIG. 1. The spray system 116 may include a spray body 130, fluid conduits 208A, 208B, a first group of fluid outlets 210A-210N, and a second group of fluid outlets 212A-212N. The spray body 130 may include a top side 216, a bottom side 218, and the inlet port 220. The spray body 130 may include a convex exterior top surface to avoid collection of the fluid during operation. The first group of fluid outlets 210A-210N and the second group of fluid outlets 212A-212N are oriented to direct fluid, such as de-ionized water, under the bottom side 218 of the spray body 130 and towards the inlet port 220. As the used fluid travels to the inlet ports 220 the fluid entrains the debris 126 from the polishing pad 104. The inlet ports 220 define a passageway to the inner plenum 222 of the spray body 130 which can guide the fluid and the debris 126 entrained with the fluid, to an exit port (not shown) and away from the polishing pad 104. In this manner, the polishing surface 102 of the polishing pad 104 may be efficiently cleaned of the debris 126.

The spray system 116 includes other features to enable efficient operation. In particular, the fluid outlets 210A, 212A may be arranged to direct fluid along fluid outlet center axes AA, AB, respectively. The fluid outlet center axes AA, AB are angled relative to each other and intersect at the convergence point 224. The fluid, the direction of which is shown at arrows 226A, 226B, exits the fluid outlets 210A, 212A in the direction of the convergence point 224 and interacts to form a turbulent, high energy zone 228 at the working polishing surface 102. Momentum of the fluid provides power to the high energy zone 228 where the fluid interacts with the debris 126 collected earlier at the polishing surface 102. The fluid dislodges the debris 126 from the working polishing surface 102 at the high energy zone 228 and the debris 126 becomes entrained in the fluid as the fluid moves within the high energy zone 228 and away from the polishing surface 102 as indicated by arrow 226C. The fluid may comprise, for example, de-ionized water and/or other substances which may chemically interact with the debris 126 to facilitate removal of the debris 126 from the polishing surface 102. In this manner, the debris 126 may be removed from the polishing surface 102.

The spray system 116 may also facilitate transport of the debris 126 from the polishing pad 104 and the high energy zone 228. The impact momentum of opposed streams of the fluid entering the high energy zone 228 acts to prevent the fluid already in the high energy zone 228 from departing the high energy zone 228 in directions parallel to the polishing surface 102. Pressure resulting from the fluid continuously flowing into the high energy zone 228 accumulates in the high energy zone 228 and the fluid and the pressure (and momentum from the fluid reflected off the polishing surface 102) pushes the fluid away from the polishing surface 102 and expands the high energy zone 228 to the at least one inlet port 220 of the spray body 130.

The spray system 116 may comprise a high pressure rinse system configured to dislodge debris 126 and used polishing fluid from the polishing pad 104. The high pressure rinse system may stream de-ionized water or other fluid through jets directed towards the polishing pad 104. If no spray recovery system is enabled by the spray system 116 the used spray, debris 126, and used polishing fluid may be subsequently collected and removed by the cleaning system 118, as discussed below.

At the completion of the spray system 116, debris 126 has been removed such that the polishing pad 104 and polishing surface 102 may be restored to maintain performance of the polishing pad 104. The spray system 116 is utilized with each rotation of the platen 108 such that all used polishing fluid is subsequently rinsed by the spray system 116 after it has passed the substrate 122, and before it reaches the cleaning system 118, with each rotation of the platen 108. Further advantages of the spray system 116 include a cooler and more stabilized platen 108 temperature.

However, excess residue such as spray fluid, used deionized water, used polishing fluid, and debris 126, may remain on the polishing pad 104 after the polishing pad 104 has passed the spray system 116. In order to remove the excess residue, spray fluid, used de-ionized water, used polishing fluid, and debris 126, the cleaning system 118 may be introduced such that the polishing surface 102 of the polishing pad is substantially made free of byproducts in real time during polishing, and further enhances within die performance.

Conventional cleaning systems maintain vacuums proximate the conditioning module and are generally upstream of a high pressure spray. Therefore, conventional cleaning systems do not effectively remove debris from the polishing pad because the polishing pad has been vacuumed prior to having sufficient debris effectively dislodged from the polishing surface. Placing the cleaning system 118 between the spray system 116 and the polishing fluid delivery assembly 112 effectively permits debris 126 to be loosened and dislodged from the polishing surface 102 of the polishing pad 104 immediately before reaching the cleaning system 118. In this manner, because the polishing pad 104 is sprayed and cleaned with each rotation of the platen 108, the substrate 122 is subsequently able to only receive new, fresh polishing fluid 124 further downstream.

Referring again to FIGS. 1 and 2, a partial view of the cleaning system 118 is maintained. In one embodiment, the cleaning system 118 may include a vacuum assembly 302 and include an inlet opening 142 coupled to a vacuum source 146 by a delivery line 308. The inlet opening 142 is configured to vacuum the polishing surface 102 at an adjustable distance between the inlet opening 142 and the polishing surface 102. The vacuum assembly 302 is configured to remove debris 126, including excess used or leftover spray, used polishing fluid, and residue, from the polishing surface 102. In this manner the vacuum assembly 302 is configured to create an airflow via the inlet opening 142 and into the vacuum source 146. Once dislodged, entrained substances, such as debris 126 and used spray, may be removed from the polishing pad 104 by travelling through the inlet opening 142 via the delivery line 308 and into the vacuum source 146 where the entrained substances made be filtered and discarded. The vacuum source 146 may be compatible with gases, fluids, and solids which may be components of the airflow, the debris 126, and/or the fluid. In this manner, the debris 126, the excess used spray, and the used polishing fluid may be removed from the polishing pad 104.

Figure 5:
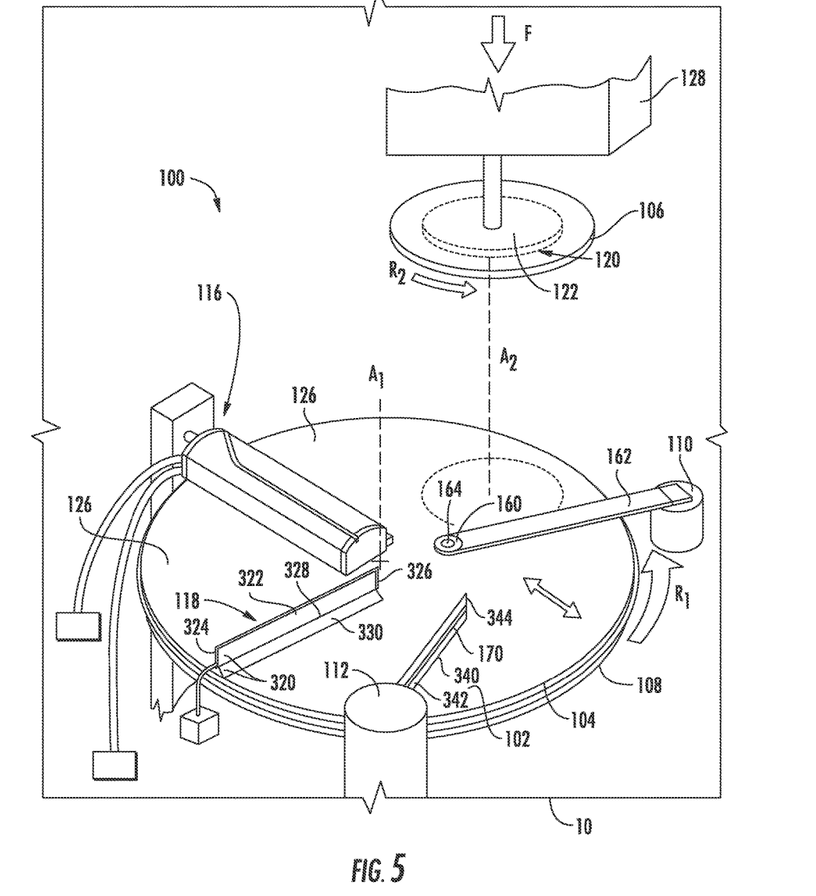
FIG. 5 is a top perspective view of an exemplary chemical-mechanical polishing (CMP) system employing a system to remove debris and fluid from a polishing pad of the CMP system.

In another embodiment, as shown in FIG. 5, the cleaning system 118 may comprise a flexible scraper blade 320 configured to sweep contaminants, such as debris 126, used spray, and used polishing fluid, from the polishing surface 102 of the polishing pad 104 during each full rotation of the platen 108. The flexible scraper blade 320 may comprise a fixed arm 322 having a first end 324 operatively coupled to the processing station 100, a second end 326 held above the polishing surface 102 of the polishing pad 104, and a base 328 facing towards the polishing surface 102 of the polishing pad 104. A flexible material 330 is attached to the base 328 of the fixed arm 322 such that the flexible material 330 extends downward from the base 328 towards the polishing surface 102 and overlaps with the polishing surface 102 such that the flexible material 330 scrapes the surface of the polishing pad 104. The flexible material 330 is a waterproof material, such as a rubber compound or other suitable material, and maintains a rigidity such that the flexible material 330 is sufficiently rigid to remove debris 126, used spray, and other such contaminates from the polishing surface 102, however the flexible material 330 is sufficiently flexible to flex upon contact with the polishing surface 102 of the polishing pad 104 when the platen 108 is in motion.

The scraper blade 320 may extend radially inward from the processing station 100 towards the center axis A1 of the platen 108. Placing the scraper blade 320 between the spray system 116 and the polishing fluid delivery assembly 112 will effectively allow the scraper blade 320 to reach each point of the polishing surface 102 of the polishing pad 104 upon each full rotation of the platen 108. The scraper blade 320 may further be angled such that the second end 326 of the scraper blade is upstream of the first end of the scraper blade 320 such that debris 126 and used spray and fluid may be directed off of the polishing surface 102, towards the first end 324 of the scraper blade 320 and into a waste removal receptacle (not shown).

Referring again to FIGS. 1 and 2, a polishing fluid delivery assembly 112 may be located within the processing station 100, and may provide fresh, new polishing fluid 124 to the polishing surface 102 of the polishing pad 104. The polishing fluid delivery assembly 112 may comprise a fixed arm 340 having a first end 342 operatively connected to the processing station 100, and a second end 344 held above the polishing surface 102 of the polishing pad 104. The polishing fluid delivery assembly 112 further comprises at least one fluid delivery hole (not shown) connected to a fluid delivery hose (not shown) configured to deliver polishing fluid 124 to the polishing pad 104. Once the polishing fluid 124 is delivered to the polishing pad 104, the fixed arm 340 may act to evenly spread the polishing fluid 124 over the polishing surface 102 of the polishing pad 104.

Additionally, the location of the processing station 100 elements provides a beneficial order for processing and cleaning the polishing surface 102. The substrate carrier head 106 is located directly downstream of the polishing fluid delivery assembly 112. The polishing fluid delivery assembly 112 provides polishing media to the polishing surface 102 upstream of the substrate 122 prior to polishing. The polishing fluid delivery assembly 112 delivers and spreads polishing fluid 124 evenly over the polishing surface 102 of the polishing pad 104 immediately prior to the introduction of the substrate 122 to the polishing fluid 124. The spray system 116 is located downstream of the substrate carrier head 106, and located between the substrate carrier head 106 and the cleaning system 118. The cleaning system 118 is located downstream of the spray system 116, and located between the polishing fluid delivery assembly 112 and the spray system 116. The spray system 116 provides a jet of high pressure water to the polishing surface 102 which lifts debris 126 from the polishing surface 102 after the polishing pad 104 has processed the substrate 122 with fresh polishing fluid 124, and thus allows the cleaning system 118 to immediately remove debris 126 and used spray system 116 water waste from the polishing pad 104 prior to delivery of additional polishing fluid 124 thereto. The optional conditioning module 110, if used, may be beneficially located downstream of the substrate carrier head 106 to condition the polishing surface 102 after the substrate 122 has been polished. Due to the spray system 116 being located between the substrate carrier head 106 and the cleaning system 118, and abrasives coming loose and embedding into the polishing pad 104 may be loosened and dislodged from the polishing pad 104 by the high pressure de-ionized water of the spray system 116 prior to cleaning from the cleaning system 118 to make more efficient removal of debris 126 from the polishing pad 104.

As discussed above, the location of the processing station 100 elements provides a beneficial order for cleaning the polishing surface 102. Specifically, the cleaning system 118 is advantageously located downstream of the spray system 116, which are downstream from substrate carrier head 106, thereby allowing for more efficient removal of debris from the polishing pad 104 during each full rotation of the platen 108 and before new polishing fluid 124 is introduced to the polishing pad 104 and substrate 122, therefore only permitting the substrate 122 to see new fresh polishing fluid with each rotation. The location of the processing station 100 elements further allows the platen temperature to remain stable, thus preventing the platen 108 from an unstable increase in temperature.

Figure 4:
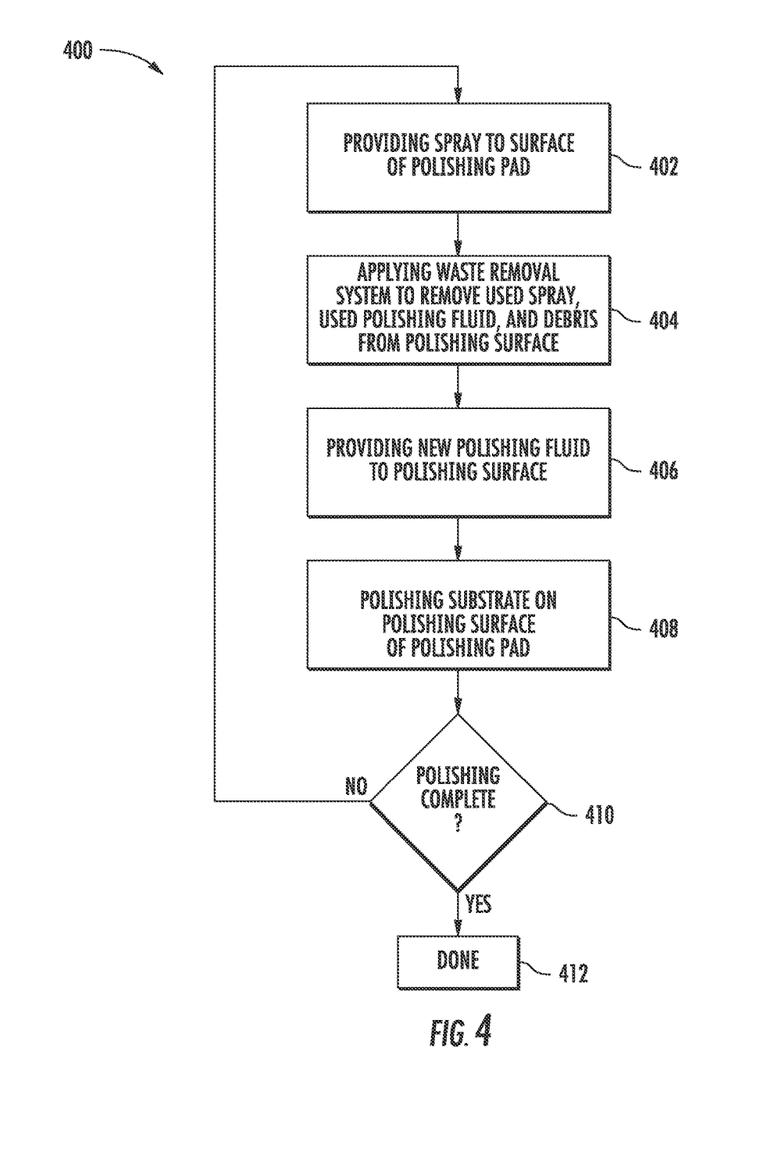
FIG. 4 is a flow diagram of an exemplary method for polishing a substrate.

FIG. 4 is a flow diagram of a method 400 for polishing substrates. It should be noted that the sequence of the method discussed below is not intended to be limiting as to the scope of the disclosure described herein, because one or more elements of the sequence may be added, deleted, and/or reordered without deviating from the basic scope of the disclosure.

At operation 402 the method may begin by providing spray, such as de-ionized water, via the spray system 116 to the polishing surface 102 at a location downstream of the substrate carrier head 106, relative to the rotation of the polishing pad 104. Spraying the surface of the polishing pad 104 lifts debris 126 and used polishing fluid from the polishing surface 102 of the polishing pad 104 during each full revolution of the polishing pad. The location is defined as a region between the substrate carrier head 106 and the cleaning system 118. At operation 404 the cleaning system 118, or waste removal system, is applied to remove used spray, debris 126, and used polishing fluid 124 from the polishing surface 102 of the polishing pad 104. After operation 404 has been completed the platen 108 and the polishing surface 102 of the polishing pad 104 are substantially free of polishing fluid 124 and excess de-ionized water spray. Furthermore, the platen temperature has been stabilized. The location is defined as a region between the spray system 116 and the polishing fluid delivery assembly 112. At operation 406 new polishing fluid 124 is dispensed via the polishing fluid delivery assembly 112 and provided onto the polishing surface 102 of the polishing pad 104. With each pass of the substrate carrier head 106 and the substrate 122 over the polishing surface 102 of the polishing pad 104, the substrate 122 is only introduced to a new dose of polishing fluid 124. The location is defined as a region between the cleaning system 118 and the substrate carrier head 106. At operation 408 the substrate carrier head 106 urges the substrate 122 towards the polishing surface 102 of the polishing pad 104 to be polished in the presence of new, fresh polishing fluid 124. The location is defined as a region between the polishing fluid delivery assembly 112 and the spray system 116. At operation 410 it is determined if the substrate 122 has completed polishing. If the substrate 122 needs further polishing, i.e. polishing is not yet complete, then the method returns to operation 402. If the substrate 122 does not need further polishing, i.e. polishing is complete, then the method moves to operation 412 which indicates that polishing is complete.

Thus, the polishing surface 102 is advantageously removed of particles and debris 126 from polishing processes, the polishing of subsequent substrates is enhanced, and the temperature of the polishing pad 104 is reduced, and further stabilized during substrate polishing due to the continuous introduction of new, fresh polishing fluid 124 and de-ionized water spray during processing.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

Testing was completed and results showed in situ byproduct removal and platen cooling during CMP. Substrate topography and scratch performance was improved by 30% to 50% in within die range on various pattern wafers, a 150 A improvement in trench loss on a tested 50×50 micrometer site, and a 60% reduction in scratch counts on internal test pattern wafers. Further testing yielded results showing a lower platen temperature over polish time as compared to conventional methods. Testing of the apparatus and methods disclosed further yielded a 50% improvement in within die performance utilizing the same polishing pressure as compared to conventional baseline processes. In tests comparing substrates polished utilizing the disclosed methods and apparatus to substrates polished utilizing a conventional baseline process, the substrate polished with the disclosed method and apparatus resulted in a within die range approximately 50% lower than the substrate polished with the baseline process. Furthermore, substrates processed with the disclosed method and apparatus yielded a reduced average scratch count by more than 60%, from approximately 17 scratches per wafer to approximately 6 scratches per wafer, with the reduced scratches being smaller in size and lower in depth comparatively.

While the foregoing is directed to embodiments of the present disclosure, other and future embodiments of the disclosure may be devised without departing from the basic scope thereof, and the scope thereof is determined by the claims that follow.

What is claimed is:

1. A processing system comprising:
 a rotatable platen;
 a substrate carrier head configured to direct a substrate against a surface of a polishing pad, wherein the polishing pad is disposed on the rotatable platen;
 a spray system including a spray body comprising:
 a first fluid outlet oriented towards a second location of the platen;
 a second fluid outlet oriented towards the second location of the platen;
 a plenum; and
 an inlet port disposed between the first fluid outlet and the second fluid outlet, the inlet port positioned to allow fluid to be removed from the polishing pad disposed on the rotatable platen and into the plenum;
 a waste removal system; and
 a polishing fluid delivery system, wherein the substrate carrier head, the spray system, the waste removal system, and the polishing fluid delivery system are positioned relative to each other above the polishing pad disposed on the rotatable platen, wherein the spray system is located directly downstream of the substrate carrier head, the waste removal system, is located directly downstream of the spray system, the polishing fluid delivery system is located directly downstream of the waste removal system, and the substrate carrier head is located directly downstream of the polishing fluid delivery system.

2. The processing system of claim 1, wherein the waste removal system comprises a vacuum source.

3. The processing system of claim 1, wherein the waste removal system comprises a scraper blade.

4. The processing system of claim 1, further comprising a conditioner arm positioned to condition the polishing pad surface.

5. The processing system of claim 1, wherein
 the spray body further comprises a first concave portion and a second concave portion disposed on opposing sides of the inlet port, and
 the first concave portion and the second concave portion form the plenum.

6. The processing system of claim 1, wherein spray system is configured to:
 supply high pressure fluid to the polishing pad through the first fluid outlet and the second fluid outlet; and
 receive depressurized fluid in the plenum through the inlet port after the fluid has been supplied through the first fluid outlet and the second fluid outlet.

7. The processing system of claim 1, wherein the first fluid outlet and the second fluid outlet are directed at a convergence point, and the inlet port is disposed directly above the convergence point.

8. The processing system of claim 1, further comprising a conditioning module positioned above the polishing pad disposed on the rotatable platen, wherein the conditioning module is located directly downstream the polishing fluid delivery assembly and the substrate carrier head is located directly downstream the conditioning module.

9. The processing system of claim 1, wherein the spray system is configured to provide a high pressure rinse from the first and second fluid outlets to the polishing pad.

10. The processing system of claim 9, wherein
the spray body further comprises a first concave portion and a second concave portion disposed on opposing sides of the inlet port, and
the first concave portion and the second concave portion form the plenum.

11. The processing system of claim 10, wherein the first fluid outlet and the second fluid outlet are directed at a convergence point, and the inlet port is disposed directly above the convergence point.

12. The processing system of claim 9, wherein the first fluid outlet and the second fluid outlet are directed at a convergence point, and the inlet port is disposed directly above the convergence point.

13. The processing system of claim 1, wherein:
the spray system is configured to provide de-ionized water spray to the polishing pad surface, wherein the de-ionized water spray removes used polishing fluid and debris;
the waste removal system is configured to remove a mixture of used de-ionized water spray and used polishing fluid from the polishing pad and dry the polishing pad; and
the polishing fluid delivery system is configured to provide new polishing fluid to the polishing pad surface, wherein the spray system, the waste removal system, and the polishing fluid delivery system are continuously utilized in real time during operation of the processing system.

14. The processing system of claim 13, wherein the spray system is configured to provide a high pressure rinse from the first and second fluid outlets to the polishing pad.

15. The processing system of claim 13, wherein the first fluid outlet and the second fluid outlet are directed at a convergence point, and the inlet port is disposed directly above the convergence point.

16. The processing system of claim 13, wherein
the spray body further comprises a first concave portion and a second concave portion disposed on opposing sides of the inlet port, and
the first concave portion and the second concave portion form the plenum.

17. The processing system of claim 16, wherein the first fluid outlet and the second fluid outlet are directed at a convergence point, and the inlet port is disposed directly above the convergence point.

18. The processing system of claim 16, wherein the spray system is configured to provide a high pressure rinse from the first and second fluid outlets to the polishing pad.

19. The processing system of claim 18, wherein the first fluid outlet and the second fluid outlet are directed at a convergence point, and the inlet port is disposed directly above the convergence point.

* * * * *